US011397222B2

(12) United States Patent
Lee et al.

(10) Patent No.: US 11,397,222 B2
(45) Date of Patent: Jul. 26, 2022

(54) SYSTEM AND METHOD FOR DETERMINING AT LEAST ONE CHARACTERISTIC OF A TRANSMITTING COIL

(71) Applicant: Toyota Motor Engineering & Manufacturing North America, Inc., Plano, TX (US)

(72) Inventors: Taehwa Lee, Ann Arbor, MI (US); Daniel Hashemi, Ann Arbor, MI (US); Hideo Iizuka, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 268 days.

(21) Appl. No.: 16/749,287

(22) Filed: Jan. 22, 2020

(65) Prior Publication Data
US 2021/0223335 A1 Jul. 22, 2021

(51) Int. Cl.
*G01R 33/02* (2006.01)
*G01R 33/00* (2006.01)
*H02J 50/12* (2016.01)

(52) U.S. Cl.
CPC ......... *G01R 33/02* (2013.01); *G01R 33/0094* (2013.01); *H02J 50/12* (2016.02)

(58) Field of Classification Search
CPC ................ G01R 33/02; G01R 33/0094; G01R 33/0005; G01R 33/028; H02J 50/12; H02J 50/00
See application file for complete search history.

(56) References Cited

U.S. PATENT DOCUMENTS 10,072,947 B1   9/2018 Mantler
11,169,007 B2 * 11/2021 Park ...................... H02K 11/21
(Continued)

FOREIGN PATENT DOCUMENTS

TW          201015593 A       4/2010

OTHER PUBLICATIONS

Lenz & Edelstein, "Magnetic Sensors and Their Applications," IEEE Sensors Journal, vol. 6, No. 3, 20 pages (2006).
(Continued)

*Primary Examiner* — Akm Zakaria
(74) *Attorney, Agent, or Firm* — Christopher G. Darrow; Darrow Mustafa PC

(57) ABSTRACT

A system for determining at least one characteristic of a transmitting coil generating a magnetic field may include a first measurement coil being wound in a first direction, a second measurement coil being wound in a second direction, a voltage measuring device, and at least one processor in communication with the voltage measuring device. The first measurement coil and the second measurement coil may be adjacent to one another. The voltage measuring device may be configured to measure a first voltage of the first measurement coil and a second voltage of the second measurement coil in response to the magnetic field generated by the transmitting coil. The at least one processor may be configured to determine the at least one characteristic of the transmitting coil based on a ratio between the first voltage and the second voltage at a predetermined frequency.

20 Claims, 10 Drawing Sheets

(56) References Cited

U.S. PATENT DOCUMENTS

| | | | | |
|---|---|---|---|---|
| 2011/0304345 A1* | 12/2011 | Hrubes | .................. | G01D 21/00 |
| | | | | 324/629 |
| 2015/0349540 A1* | 12/2015 | Lee | ........................ | H02J 50/90 |
| | | | | 307/104 |
| 2019/0103771 A1* | 4/2019 | Piasecki | ............... | H04B 5/0037 |
| 2020/0412222 A1* | 12/2020 | Tarelli | .................... | H02K 33/12 |

OTHER PUBLICATIONS

Ripka & Janosek, "Advances in Magnetic Filed Sensors," IEEE Sensors Journal, vol. 10, No. 6, 10 pages (2010).

Yi et al., "Subwavelength angle-sensing photodetectors inspired by directional hearing in small animals," Nature Nanotechnology 13, 1143, 36 pages (2018).

\* cited by examiner

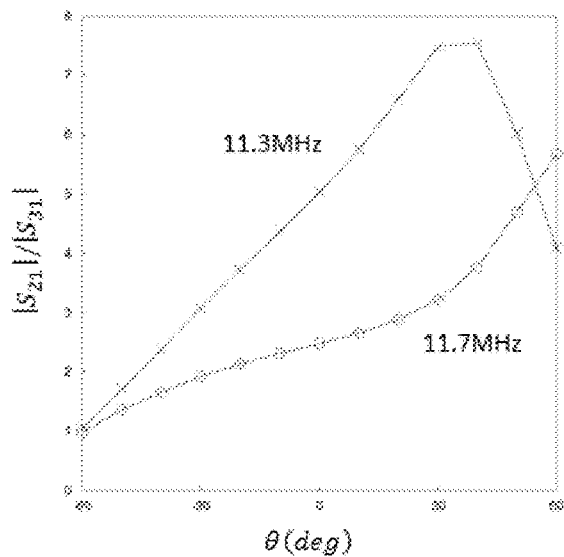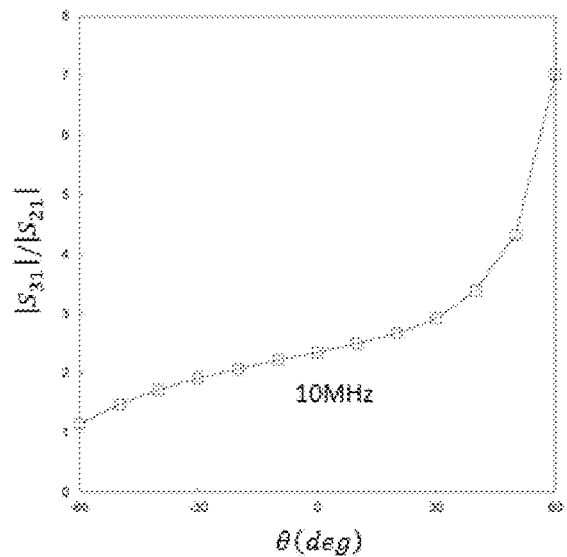
FIG. 6A  FIG. 6B
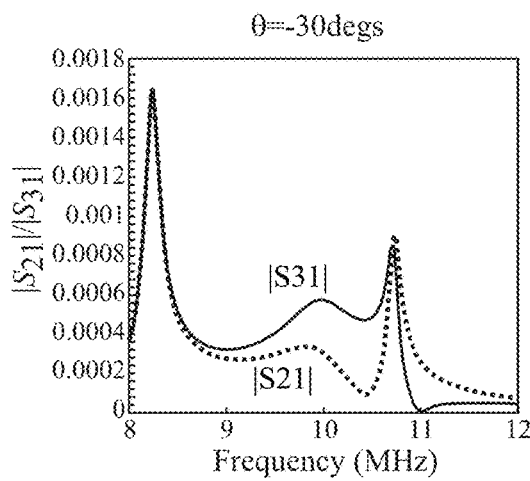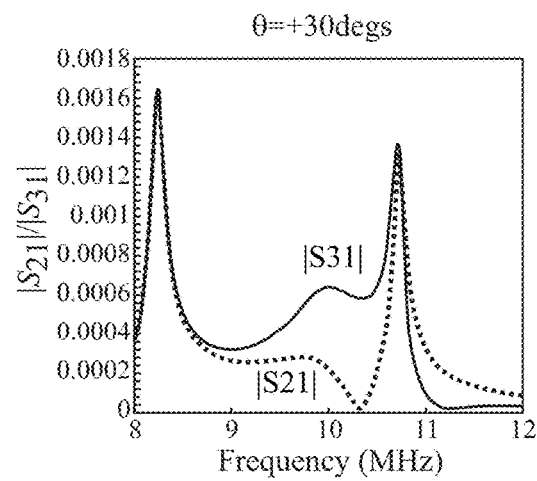
FIG. 7  FIG. 8

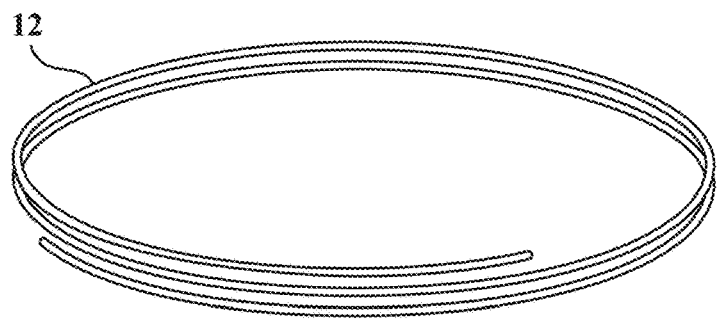
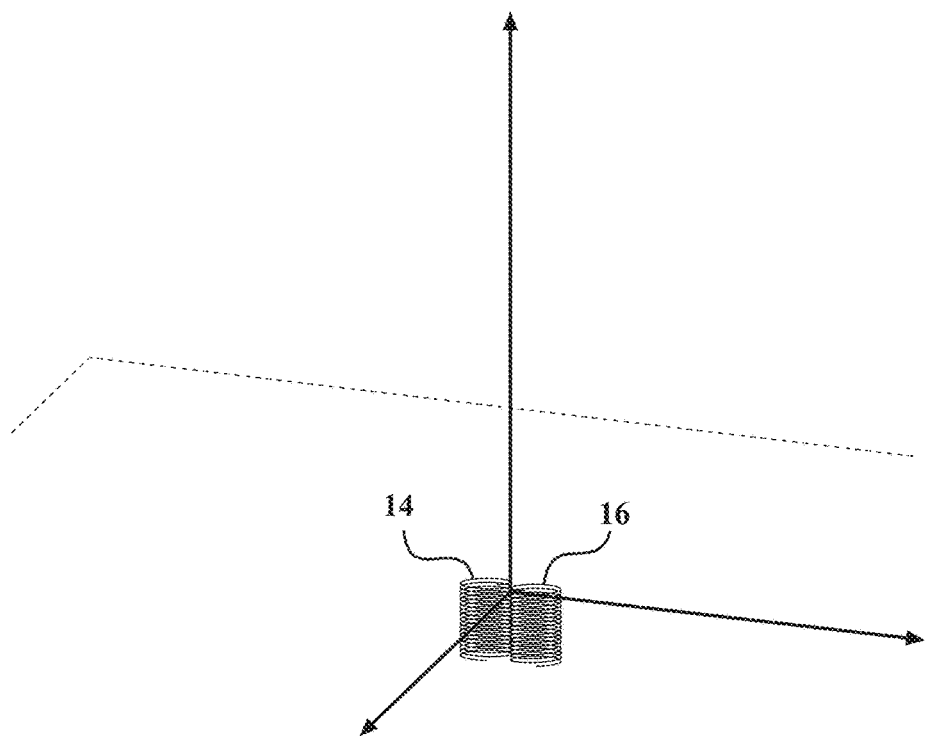
FIG. 9

SYSTEM AND METHOD FOR DETERMINING AT LEAST ONE CHARACTERISTIC OF A TRANSMITTING COIL

TECHNICAL FIELD

The subject matter described herein relates, in general, to systems and methods for determining at least one characteristic of a transmitting coil.

BACKGROUND

The background description provided is to present the context of the disclosure generally. Work of the inventors, to the extent it may be described in this background section, and aspects of the description that may not otherwise qualify as prior art at the time of filing, are neither expressly nor impliedly admitted as prior art against the present technology.

Some electronic devices with batteries have the ability to charge the batteries using an inductive charging type methodology. Inductive charging is a form of wireless power transfer that utilizes electromagnetic induction to provide electricity from a transmitting coil to an electronic device that has a receiving coil.

Inductive charging occurs when an alternating current passes through a transmitting coil and creates a magnetic field. The magnetic field emitted from the transmitting coil fluctuates in strength as the alternating current is continually changing velocity. This magnetic field emitted from the transmitting coil causes an alternating electrical current in a receiving coil. This alternating electrical current in the receiving coil can then be utilized to charge the battery of the electronic device having the receiving coil.

However, the placement of the transmitting coil with respect to the receiving coil as well as other aspects of the transmitting coil, such as the direction that the transmitting coil is wound, can impact the efficiency of the energy transfer from the transmitting coil to the receiving coil.

SUMMARY

This section generally summarizes the disclosure and is not a comprehensive explanation of its full scope or all its features.

In one embodiment, a system for determining at least one characteristic of a transmitting coil generating a magnetic field may include a first measurement coil being wound in a first direction, a second measurement coil being wound in a second direction, a voltage measuring device, and at least one processor in communication with the voltage measuring device. The first measurement coil and the second measurement coil may be adjacent to one another. The voltage measuring device may be configured to measure a first voltage of the first measurement coil and a second voltage of the second measurement coil in response to the magnetic field generated by the transmitting coil. The at least one processor may be configured to determine the at least one characteristic of the transmitting coil based on a ratio between the first voltage and the second voltage at a predetermined frequency. The at least one characteristic of the transmitting coil may include at least one of a direction that the transmitting coil is wound and an angle of incidence of the transmitting coil with respect to the first and second measurement coils.

In another embodiment, a method for determining at least one characteristic of a transmitting coil generating a magnetic field may include the steps of measuring a first voltage of a first measurement coil wound in a first direction in response to the magnetic field generated by the transmitting coil, measuring a second voltage of a second measurement coil wound in a second direction in response to the magnetic field generated by the transmitting coil, and determining the at least one characteristic of the transmitting coil based on a ratio between the first voltage and the second voltage at a predetermined frequency. The at least one characteristic of the transmitting coil may include at least one of a direction that the transmitting coil is wound and an angle of incidence of the transmitting coil with respect to the first and second measurement coils.

In yet another embodiment, a non-transitory computer-readable medium for determining at least one characteristic of a transmitting coil generating a magnetic field comprises instructions that when executed by one or more processors cause the one or more processors to measure a first voltage of a first measurement coil wound in a first direction in response to the magnetic field generated by the transmitting coil, measure a second voltage of a second measurement coil wound in a second direction in response to the magnetic field generated by the transmitting coil, and determine the at least one characteristic of the transmitting coil based on a ratio between the first voltage and the second voltage at a predetermined frequency. The at least one characteristic of the transmitting coil may include at least one of a direction that the transmitting coil is wound and an angle of incidence of the transmitting coil with respect to the first and second measurement coils.

Further areas of applicability and various methods of enhancing the disclosed technology will become apparent from the description provided. The description and specific examples in this summary are intended for illustration only and are not intended to limit the scope of the present disclosure.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one embodiment of the boundaries. In some embodiments, one element may be designed as multiple elements or multiple elements may be designed as one element. In some embodiments, an element shown as an internal component of another element may be implemented as an external component and vice versa. Furthermore, elements may not be drawn to scale.

FIGS. 6A and 6B illustrate charts comparing the ratio of the voltages of the two measurement coils at different angles of incidence between the measurement coils and the transmitting coil at different frequencies;

FIGS. 7 and 8 illustrate the ratio of the voltages of the two measurement coils at different frequencies at a −30° incidence angle and a 30° incident angle, respectively;

FIG. 9 illustrates one example of how the system of FIG. 1 determines the direction that the transmitting coil is wound;

DETAILED DESCRIPTION

A system and method for determining a characteristic of a transmitting coil utilizes two measurement coils (and possibly more measurement coils) that are wound in opposite directions. The two measurement coils may have a resonant frequency substantially similar to that of the resonant frequency of the transmitting coil.

A voltage measuring device measures the voltages of the two measurement coils generated in response to a magnetic field generated by the transmitting coil. The voltages measured of the two measurement coils may be measured at a specified frequency. The specified frequency can be any frequency, but as will be explained later, may be determined based on one or more factors. Based on the ratios between the voltages of the two measurement coils, the system can determine one or more characteristics of the transmitting coil, such as the direction the transmitting coil is wound and/or the position of the transmitting coil.

Figure 1:
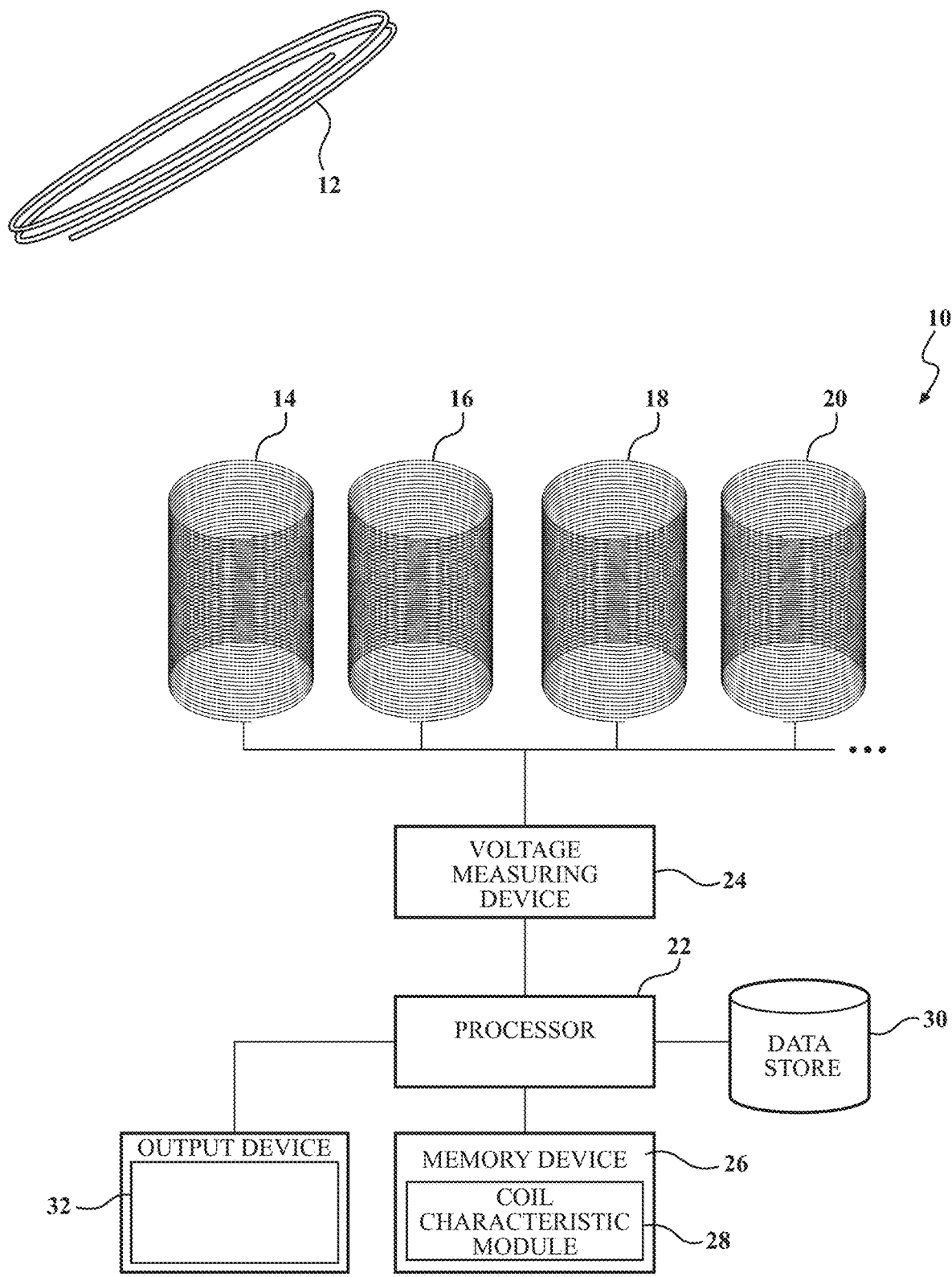
FIG. 1 illustrates a system for determining at least one characteristic of a transmitting coil.

Referring to FIG. 1, a system 10 for measuring at least one characteristic of a transmitting coil 12 is shown. The transmitting coil 12 may be a coil that is utilized in an inductive charging system. Moreover, inductive charging occurs when an alternating current passes through the transmitting coil 12 and creates a magnetic field. The magnetic field emitted from the transmitting coil 12 fluctuates in strength as the alternating current is continually changing velocity. This magnetic field emitted from the transmitting coil 12 causes an alternating electrical current in the receiving coil.

The system 10 includes at least two measurement coils. In this example, the system 10 includes measurement coils 14, 16, 18, and 20. However, it should be understood that the system 10 may utilize as few as two measurement coils. The use of additional measurement coils allows for additional properties, such as the position of the transmitting coil 12 to be determined by the system 10. The measurement coils 14, 16, 18, and 20 are generally wound in opposite directions. Moreover, when two measurement coils are utilized, one measurement coil is wound in one direction, while the other measurement coil is wound in another direction. If three measurement coils are utilized, two measurement coils are wound in one direction, while the third measurement coil is wound in the opposite direction. Similarly, if four measurement coils are utilized, two of the measurement coils are wound in one direction, while the other two measurement coils are wound in the opposite direction.

Figure 2:
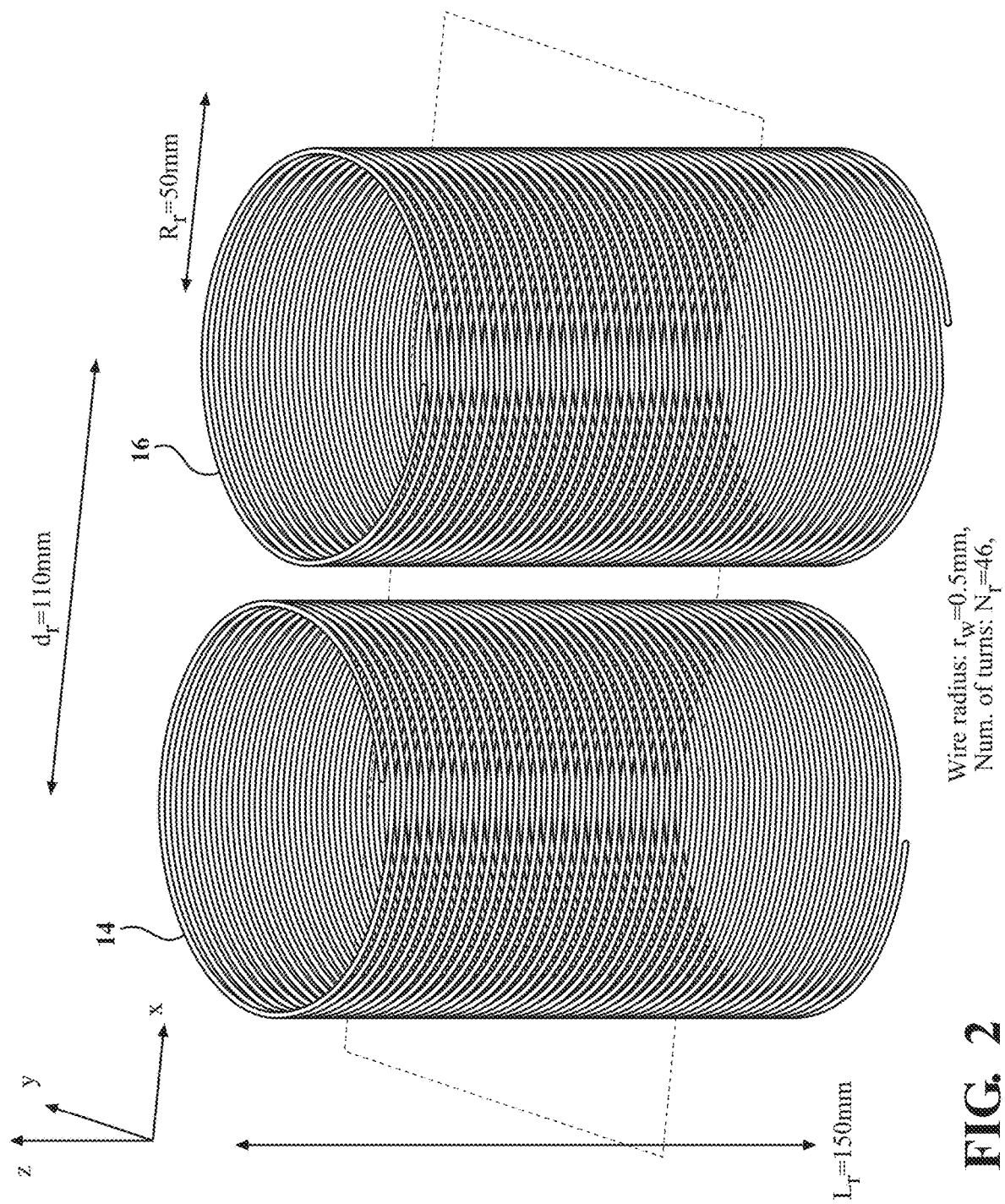
FIG. 2 illustrates two measurement coils of the system of FIG. 1.

Generally, the measurement coils 14, 16, 18, and 20 are substantially the same size and are individually smaller than the transmitting coil 12. Referring to FIG. 2, an example of the measurement coils 14 and 16 are shown. In this example, the measurement coils 14 and 16 each have a length of approximately 150 mm and a radius of approximately 50 mm. The distance between the centers of the measurement coils 14 and 16 is approximately 110 mm. As such, the space between the measurement coils 14 and 16 is approximately 10 mm. The wire radius for the measurement coils 14 and 16 is approximately 0.5 mm, and the number of turns that form the measurement coils 14 and 16 are approximately 46. It should be understood that this is just but one example of the dimensions utilized for the measurement coils 14 and 16. Any one of a number of different dimensions can be utilized.

Returning to FIG. 1, the resonant frequencies of the measurement coils 14, 16, 18, and 20 may be substantially similar to each other. By "substantially similar" it should be understood this to mean a 10% variance. Similarly, the transmitting coil 12 may have a substantially similar resonant frequency to one or all of the measurement coils 14, 16, 18 and/or 20. Like before, "substantially similar" allows for a 10% variance in resonant frequencies.

The system 10 also includes at least one processor 22. The at least one processor 22 may be a single processor or multiple processors working in concert. Further, it should be understood that the at least one processor 22 may include processors that are remote from the system 10 and therefore perform the functions of the processor 22 in a distributed fashion.

The processor 22 may be in communication with a memory device 26. The memory device 26 may be a single memory device or may be multiple memory devices. The memory device 26 may be any type of device capable of storing electronic information, such as solid-state memory devices, optical memory devices, magnetic memory devices, and the like. In this example, the memory device 26 contains a coil characteristic module 28 that contains instructions that, when executed by the processor 22, causes the processor 22 to perform one or more methodologies described in this specification.

A voltage measuring device 24 is also in communication with the processor 22 as well as the measurement coils 14, 16, 18 and/or 20. The voltage measuring device is capable of measuring the voltages of each of the measurement coils 14, 16, 18, and/or 20. Moreover, as stated before, the transmitting coil 12 emits a magnetic field that causes an alternating current to generate in the measurement coils 14, 16, 18, and/or 20. The voltage measuring device 24 is able to measure the voltage generated in response to the magnetic field from the transmitting coil 12 at one or more frequencies. These measurements performed by the voltage measuring device 24 may then be provided to the processor 22 for processing. The voltage measuring device 24 may be an analog, digital, or another type of voltmeter or device configured to measure a voltage.

The system 10 may also include a data store 30 that is in communication with the processor 22. The data store 30 is, in one embodiment, an electronic data structure such as a database that is stored in the memory device 26 or another memory and that is configured with routines that can be executed by the processor 22 for analyzing stored data, providing stored data, organizing stored data, and so on. Thus, in one embodiment, the data store 30 stores data used by the coil characteristic module 28 in executing various functions. In one embodiment, the data store 30 includes measurements performed by the voltage measuring device 24 of the measurement coils 14, 16, 18, and/or 20.

The system 10 may also include an output device 32 that is in communication with the processor 22. The output device 32 can be any type of device that receives information regarding the one or more characteristics of the transmitting coil 12, as determined by the system 10. As such, the output device 32 could be a device that utilizes the characteristics of the transmitting coil 12 to improve the charging performance of a battery connected to a receiving coil. Additionally or alternatively, the output device 32 could be a visual and/or audible output device that provides visual and/or audible information regarding the characteristics of the transmitting coil 12.

Referring back to the memory device 26, as stated previously, the memory device 26 may include a coil characteristic module 28. The coil characteristic module 28 may include instructions that, when executed by the processor 22, cause the processor 22 to perform any of the methodologies disclosed in this specification. Moreover, in one example, when the processor 22 executes instructions stored within the coil characteristic module 28, the processor 22 may be configured to receive one or more of the voltages determined by the voltage measuring device 24. As such, the processor 22 obtains the voltages of the measurement coils 14, 16, 18 and/or 20 measured by the voltage measuring device 24 at a certain frequency.

As will be explained later, the frequency utilized to measure the voltages of the measurement coils 14, 16, 18 and/or 20 can vary and can be any frequency; however, the frequency utilized to measure each of the coils should be the same. As such, in one example, the predetermined frequency may be 11.7 MHz, but it should be understood that any frequency can be utilized. Different methodologies for selecting the frequency will be described later in this specification, including a description of what frequencies may be more helpful and/or more preferred than others.

The coil characteristic module 28 may also include instructions that cause the processor 22 to determine at least one characteristic of the transmitting coil 12 based on one or more ratios of the voltages measured from the measurement coils 14, 16, 18 and/or 20. In one example, one or more combinations of ratios of different voltages of measurement coils 14, 16, 18 and/or 20 could be utilized to determine the direction that the transmitting coil is wound and/or the position of the transmitting coil 12 with respect to one or more of the measurement coils 14, 16, 18, and/or 20.

Figure 3A:
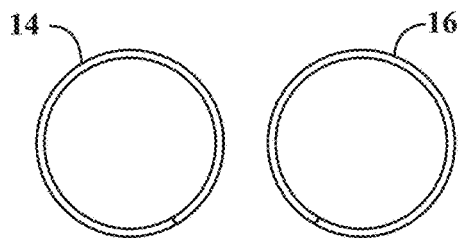
FIGS. 3A-3C illustrate different examples of different arrangements of measurement coils.
Figure 3B:
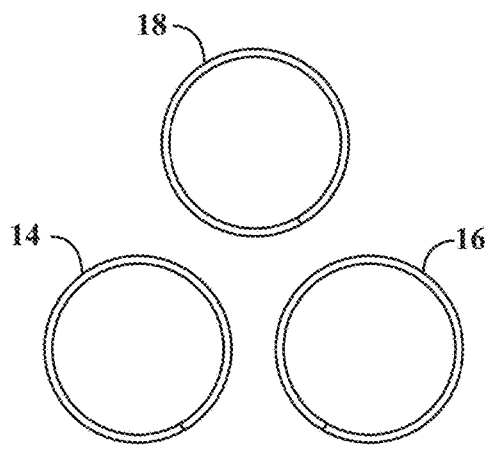
Figure 3C:
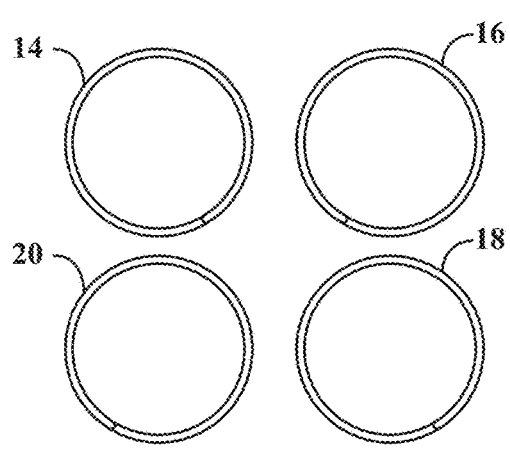

As stated before, at least two measurement coils may be utilized by the system 10. As such, in one example, only measurement coils 14 and 16 may be utilized, but in other examples, more than two measurement coils may be utilized. As to the general placement of the measurement coils with respect to each other, when two measurement coils are utilized, the measurement coils 14 and 16 may be adjacent to one another as indicated in FIG. 3A. If three measurement coils are utilized, the measurement coils 14, 16, and 18 may be arranged in a triangular pattern, as shown in FIG. 3B. If four measurement coils are utilized, such as measurement coils 14, 16, 18, and 20, the four measurement coils 14, 16, 18, and 20 may be arranged in a rectangular pattern as indicated in FIG. 3C.

Figure 3D:
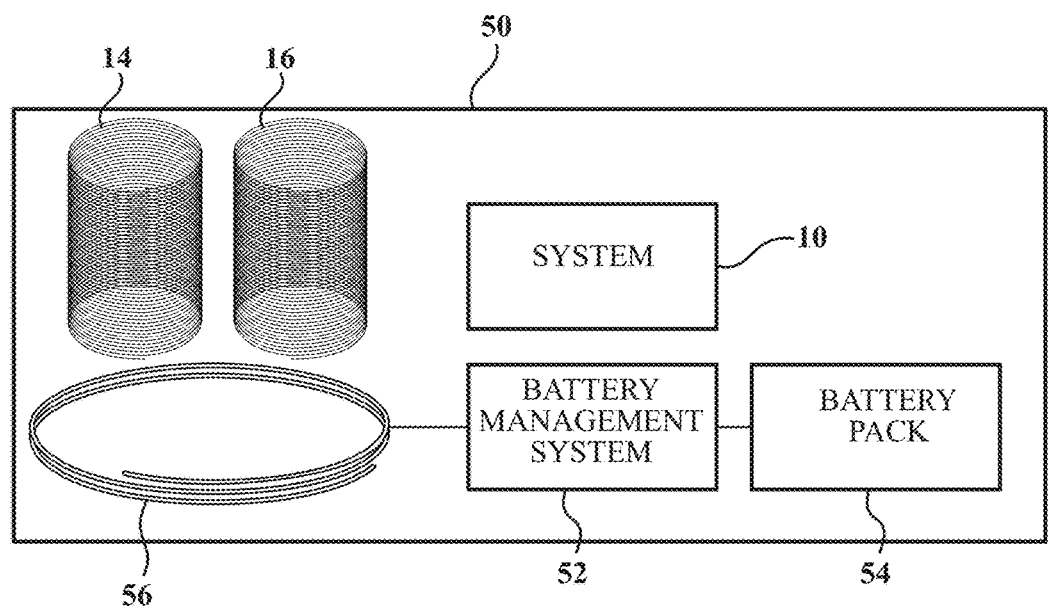
FIG. 3D illustrates the system of FIG. 1 packaged in a housing with a receiving coil.

Referring to FIG. 3D, shown is the system 10 located within a housing 50, which is a receiving module or receiving system. Here, the system 10 includes two measurement coils 14 and 16. In addition, the system 10 may also include a receiving coil 56. The receiving coil 56 essentially receives the magnetic field generated by the transmitting coil 12 of FIG. 1 and generates a current in response to receiving the magnetic field from the transmitting coil 12. The current generated in the receiving coil 56 can be fed to a battery management system 52, which can then be used to charge a battery pack 54. The battery pack 54 could be a battery pack of any one of a number of different electronic devices, including small electronic devices such as mobile phones, tablet devices, and the like but could also include large devices such as vehicles. Again, it should be understood that any electronic device could utilize the system 10.

Figure 4:
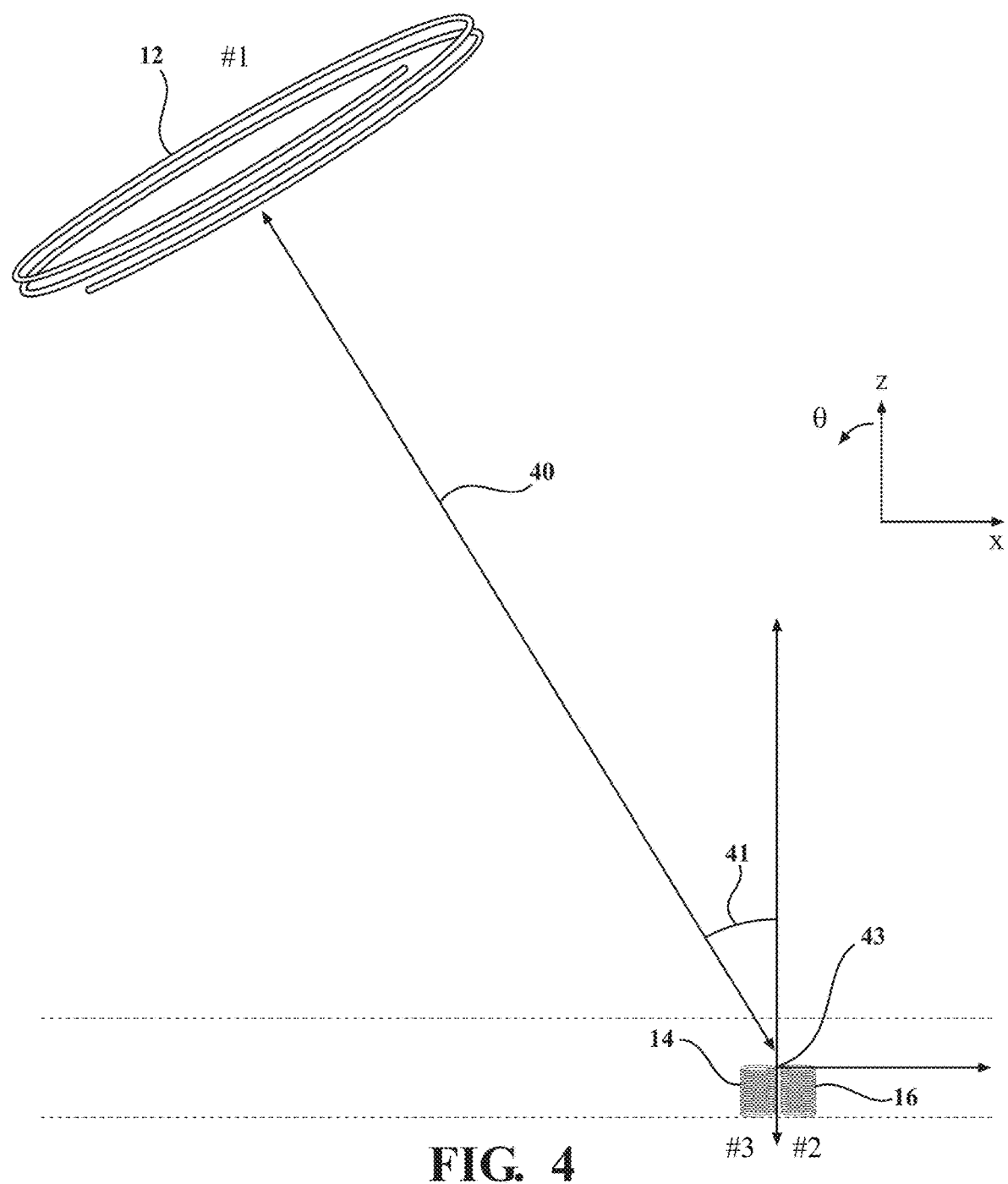
FIG. 4 illustrates a diagram explaining how the system determines the at least one characteristic of the transmitting coil.

Referring to FIG. 4, one example explaining how the system 10 of FIG. 1 is able to determine one or more characteristics of the transmitting coil 12 is shown. In this example, the transmitting coil 12 has a radius of 750 mm, a length of 100 mm, a wire radius of 0.5 mm, a number of turns of 2.265, and is a right-handed wound coil. It should be understood that the transmitting coil 12 is not limited to these dimensions described above and can be any dimensions that allow the transmitting coil 12 to generate and emit a magnetic field.

Also shown are the measurement coils 14 and 16. The transmitting coil 12 is located at a distance 40 of 3 meters from a midpoint 43 of the measurement coils 14 and 16, but it should be understood that any distance could be realized. Further, the angle of incidence 41 between the transmitting coil 12 and the midpoint 43 of the measurement coils 14 and 16 is 30°. Again, this is just an example in any angle of incidence could be utilized.

As stated before, the measurement coils 14 and 16 may have dimensions similar to the measurement coils mentioned in FIG. 2. Furthermore, one of the measurement coils 14 may be wound in one direction (such as a left-handed direction) and the other measurement coil 16 may be wound in the opposite direction (such as a right-handed direction). Generally, the resonant frequency of the measurement coils 14 and 16 are substantially similar. Further, the resonant frequency of the measurement coils 14 and 16, as well as the transmitting coil 12, may also all be substantially similar.

Figure 5:
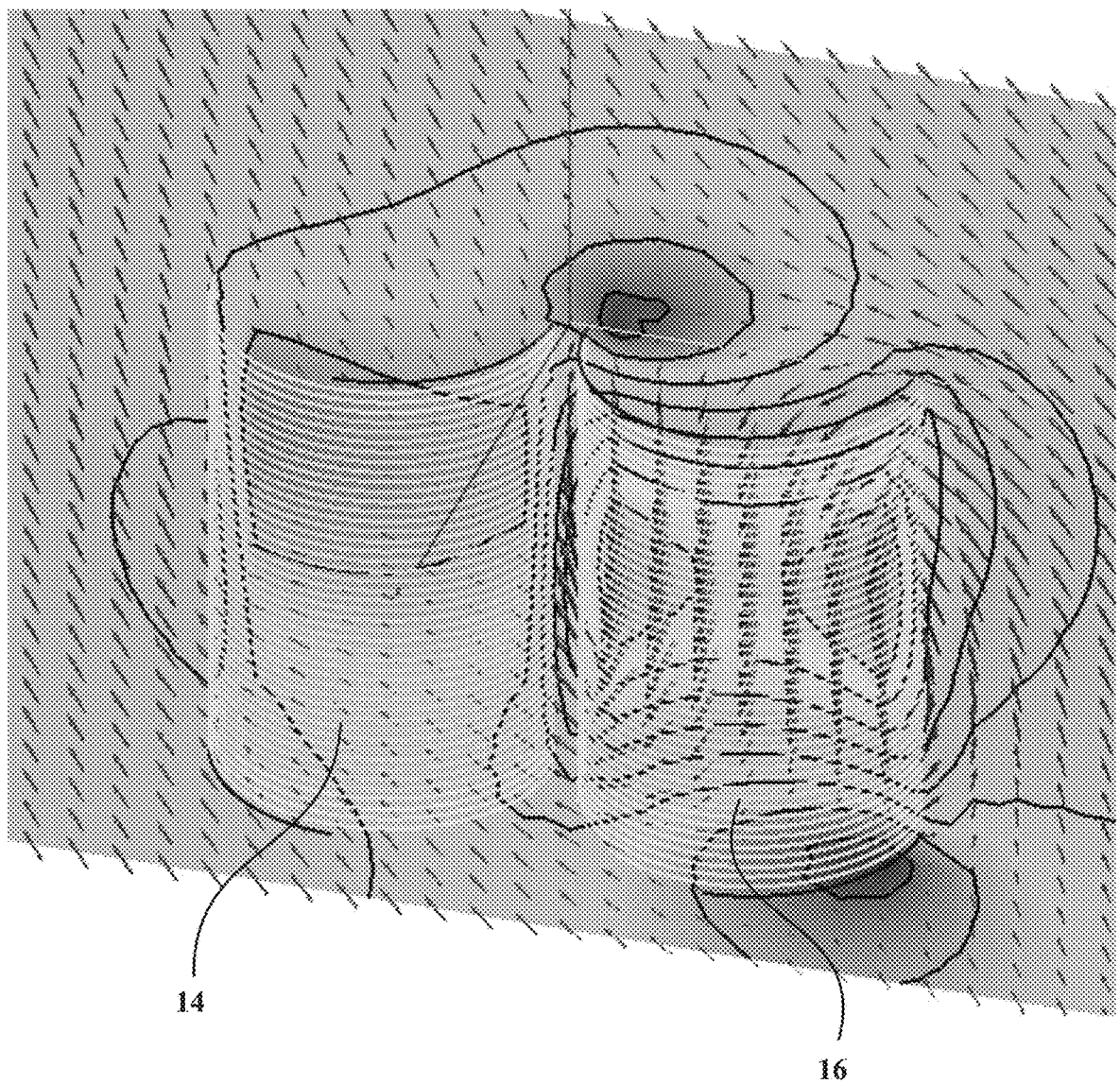
FIG. 5 illustrates the magnetic field generated by the measurement coils in response to the magnetic field from the transmitting coil.

When the transmitting coil 12 generates a magnetic field, the magnetic field generated by the measurement coils 14 and 16 in response to the magnetic field from the transmitting coil 12 may differ based on the fact that the measurement coils 14 and 16 are wound in opposite directions. An example of the magnetic field generated by the measurement coils 14 and 16 in response to the magnetic field from the transmitting coil 12 is illustrated in FIG. 5.

When one measures the voltages of each of the measurement coils 14 and 16 at a predetermined frequency and then compares the ratio of the voltages measured, the system 10 has the ability to determine one or more characteristics of the transmitting coil 12, such as the direction that the transmitting coil 12 is wound and/or the angle of incidence 41 that the transmitting coil 12 is in respect to the midpoint 43 between the measurement coils 14 and 16.

Coils 12, 16, and 14 are labeled as 1, 2, and 3 for, respectively. The scattering matrix components have the forms of $S_{21}=V_2/V_1$ and, $S_{31}=V_3/V_1$, where $V_1$, $V_2$, and $V_3$ are the voltages of the three coils labeled with 1, 2, and 3. (The voltage terminal is located at the middle of each coil.) Thus, $S_{21}/S_{31}$ represents the voltage ratio of $V_2/V_3$, and we use $S_{21}$ and $S_{31}$ for evaluating the voltage ratio. For example, referring to FIGS. 6A and 6B, $S_{21}$ is the voltage measured in the measurement coil 16, while $S_{31}$ represents the voltage measured in the measurement coil 14 in response to the magnetic field generated by the transmitting coil 12. FIGS. 6A and 6B illustrates the ratio of the voltage $|S_{21}|$ to $|S_{31}|$.

The values of the ratios may be generated based on the absolute values of the voltages $S_{21}$ and $S_{31}$.

In addition, FIGS. 6A and 6B illustrates the ratio of the voltages $|S_{21}|$ (coil 16) to $|S_{31}|$ (coil 14) at different predetermined frequencies (such as 11.3 MHz, 11.7 MHz, and 10 MHz) as well as when the transmitting coil 12 is at different angles of incidence 41 with respect to the midpoint 43 of the measurement coils 14 and 16. The frequencies 11.3 MHz, 11.7 MHz, and 10 MHz are merely examples of different frequencies that can be utilized when measuring the voltages generated by the measurement coils 14 and/or 16.

As can be seen in FIG. 6A, the ratio of the voltages $|S_{21}|$ to $|S_{31}|$ generally varies as the angle of incidence 41 of the transmitting coil 12 varies. However, the frequency of 11.7 MHz creates a superior one-to-one set of values. Moreover, if one utilizes 11.7 MHz as the predetermined frequency for measuring the voltages of the measurement coils 14 and 16 when the transmitting coil 12 is between −60° and 60° angle 41 of incidence, one can utilize the ISA to ISA ratio to determine the angle of incidence of the transmitting coil 12 from −60° to 60°.

When a system only requires a narrow angle range e.g. from −30° to 30°, one can utilize 11.3 MHz, which gives higher sensitivity (voltage ratio per angle) than the use of 11.7 MHz. Instead, one needs to care that some of the values are repeated out of the angle range from −30° to 30° and, therefore, could cause a miscalculation. For example, at 11.3 MHz, the ISA to ISA ratio is the same at approximately 60° as it is at approximately −25°. In addition, one can use another frequency of 10 MHz. In this case, selecting the ratio of $|S_{31}|/|S_{21}|$, which is the inverse of $|S_{21}|/|S_{31}|$, shows a similar angular response as the case of 11.7 MHz, as shown in FIG. 6B. Referring to FIGS. 7 and 8, the measurement of the voltages $S_{31}$ (solid line, coil 14) and $S_{21}$ (dotted line, coil 16) from different frequencies between 8 MHZ and 12 MHz are shown at an angle of incidence 41 at −30° and 30°, respectively.

As stated before, one of the characteristics of the transmitting coil 12 that can be determined is the angle of incidence 41 by measuring the voltages of the measurement coils 14 and 16 and comparing the ratio of the measurement coils 14 and 16 at a predetermined frequency. However, in addition to determining the angle of incidence 41, other characteristics can also be determined.

Figure 10:
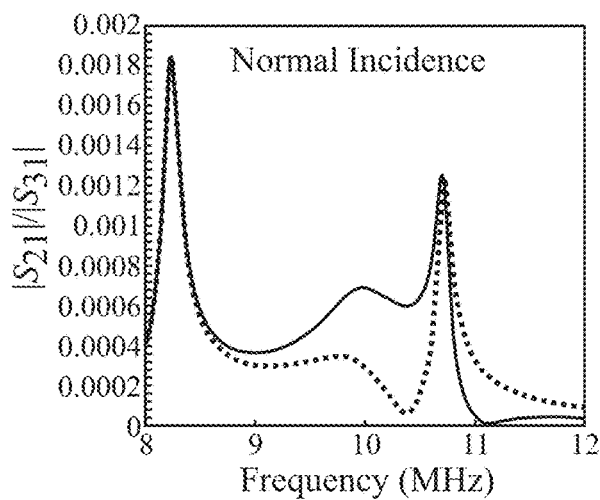
FIG. 10 illustrates the ratio of the voltages of the two measurement coils at a normal incidence angle at different frequencies.
Figures 11A, 11B, 11C, 11D:
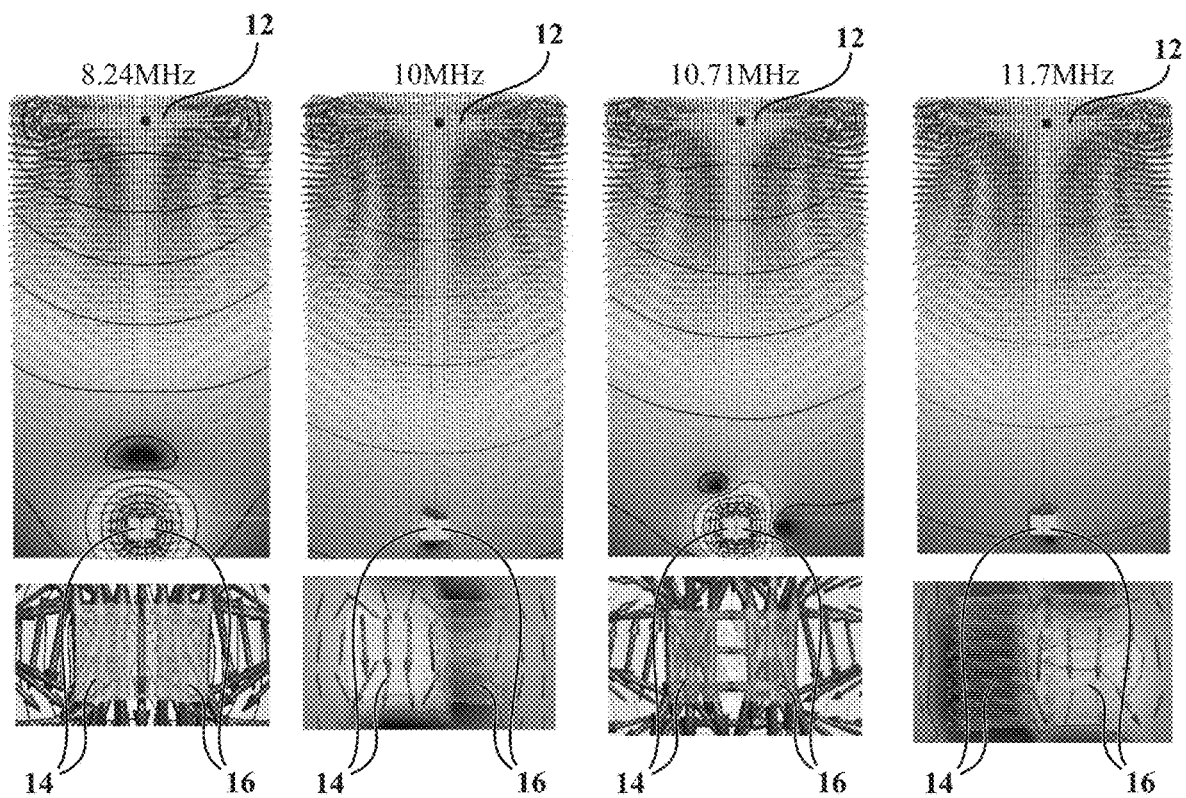
FIGS. 11A-11D illustrate the magnetic fields generated by the transmitting coil and the two measurement coils at different frequencies.

Referring to FIGS. 9 and 10, an example of a transmitting coil 12 is shown with respect to the measurement coils 14 and 16. In this example, the transmitting coil 12 is a right-handed wound coil, the measurement coil 14 is a left-handed wound coil and the measurement coil 16 is a right-handed coil. As best shown in FIG. 10, the ratio of the voltages of the measurement coils 14 and 16 are shown at a normal angle of incidence (i.e., 0°) and at a range of frequencies between 8 MHz and 12 MHz.

However, if the transmitting coil 12 was a left-handed transmitting coil, the ratio between the voltages $S_{31}$ and $S_{21}$ would switch. As such, $S_{21}$ would mimic $S_{31}$, while $S_{31}$ would mimic $S_{21}$ of FIG. 10. As such, using this information, the system 10 can also determine if the transmitting coil 12 is a left-handed wound transmitting coil or right-handed wound transmitting coil.

FIGS. 11A-11D illustrate the magnetic fields generated by the transmitting coil 12 as it interacts with the measurement coils 14 and 16 at different frequencies of 8.24 MHz, 10 MHz, 10.71 MHz and 11.7 MHz. The way that the magnetic field generated by the transmitting coil 12 interacts with the measurement coils 14 and 16 would be reversed if the transmitting coil 12 was changed from a right-handed coil to a left-handed coil. As such, using this information, the system 10 can determine based on the ratio between the voltages of the measurement coils 14 and 16 the direction that the transmitting coil 12 is wound.

It should be understood that this ratio is generated because one of the measurement coils 14 is wound in one direction, while the other measurement coil 16 is wound in the opposite direction. If both measurement coils 14 and 16 are wound in the same direction, the voltages measured would be identical and thus not create a ratio between them and therefore could not be utilized to determine one or more characteristics of the transmitting coil 12.

As such, based on the ratio between the voltages from the measurement coils 14 and 16, the system 10 can determine an angle of incidence 41 of the transmitting coil 12 with respect to the measurement coils 14 and 16. Knowledge of the angle of incidence 41 and/or the direction that the transmitting coil 12 is wound can be used by a battery management system so as to more efficiently charge any battery connected to a receiving coil, such as receiving coil 56 of FIG. 3D.

Figure 12:
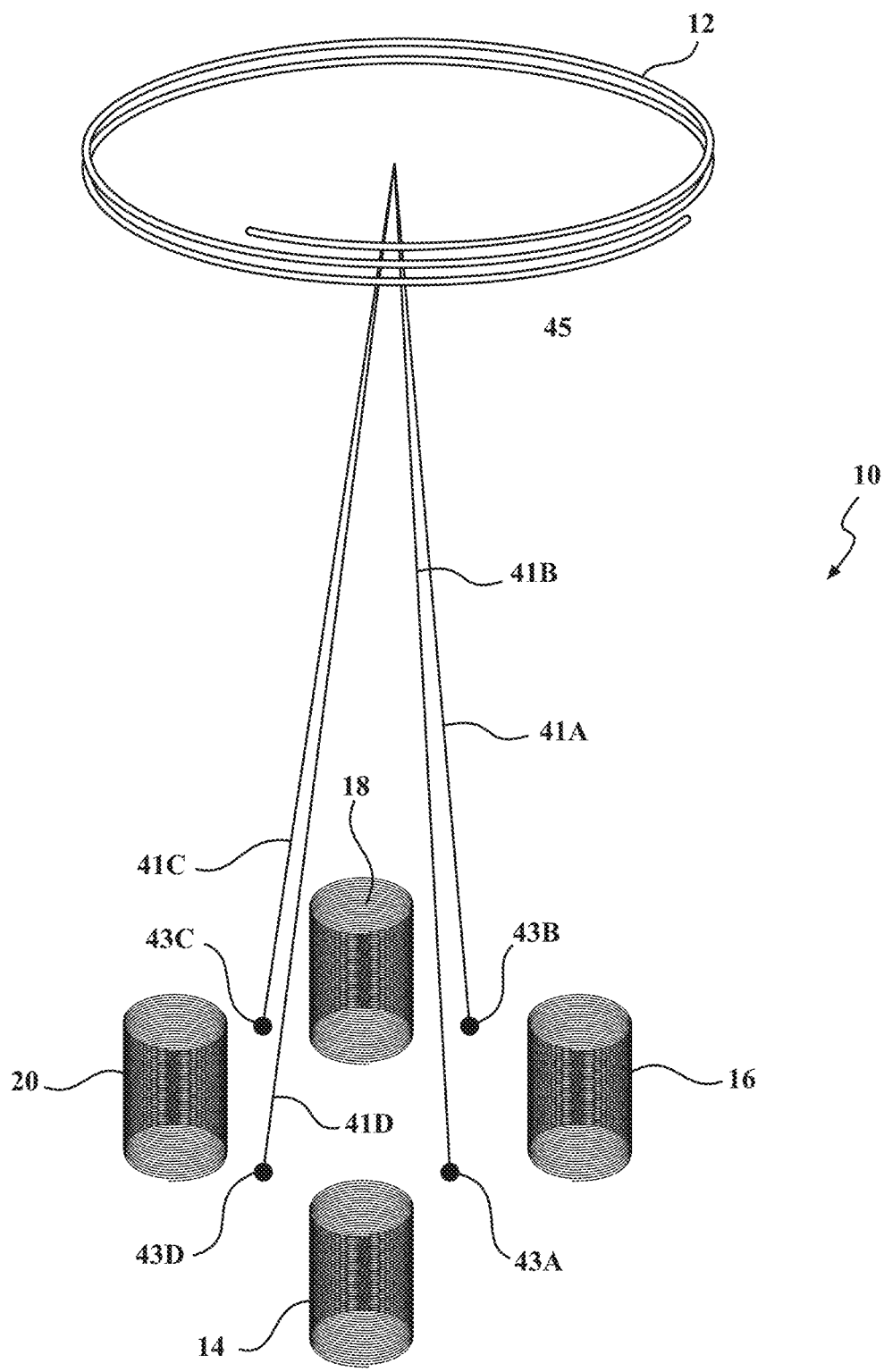
FIG. 12 illustrates a diagram explaining how the system determines a position of the transmitting coil.

It should also be understood that if additional measurement coils are utilized, such as a third measurement coil 18 and/or fourth measuring coil 20, additional measurements and therefore characteristics can be determined regarding the transmitting coil 12. Referring to FIG. 12, illustrated is an example of a transmitting coil 12 along with four measurement coils 14, 16, 18, and 20 arranged in a rectangular orientation. The measurement coils 14 and 18 are wound in one direction, while the measurement coils 16 and 20 are wound in another direction. A midpoint 43A is located between the measurement coils 14 and 16, a midpoint 43B is located between the measurement coils 16 and 18, a midpoint 43C is located between the measurement coils 18 and 20, and a midpoint 43D is located between the measurement coils 14 and 20.

Using the methodology previously described, the system can determine the angles of incidence 41A, 41B, 41C, and 41D between the midpoints 43A, 43B, 43C, and 43D, respectively, and the center of the magnetic field generated by the transmitting coil 12. Using the angles of incidence 41A-41D, and the known positions of the measurement coils 14, 16, 18, and 20, the system 10 can determine the location of the transmitting coil 12 in a two-dimensional or three-dimensional space by determining the location of where the angles of incidence converge 41A-41D. The point 45 is where the angles of incidence converge and can be utilized to determine the location of the transmitting coil 12.

Figure 13:
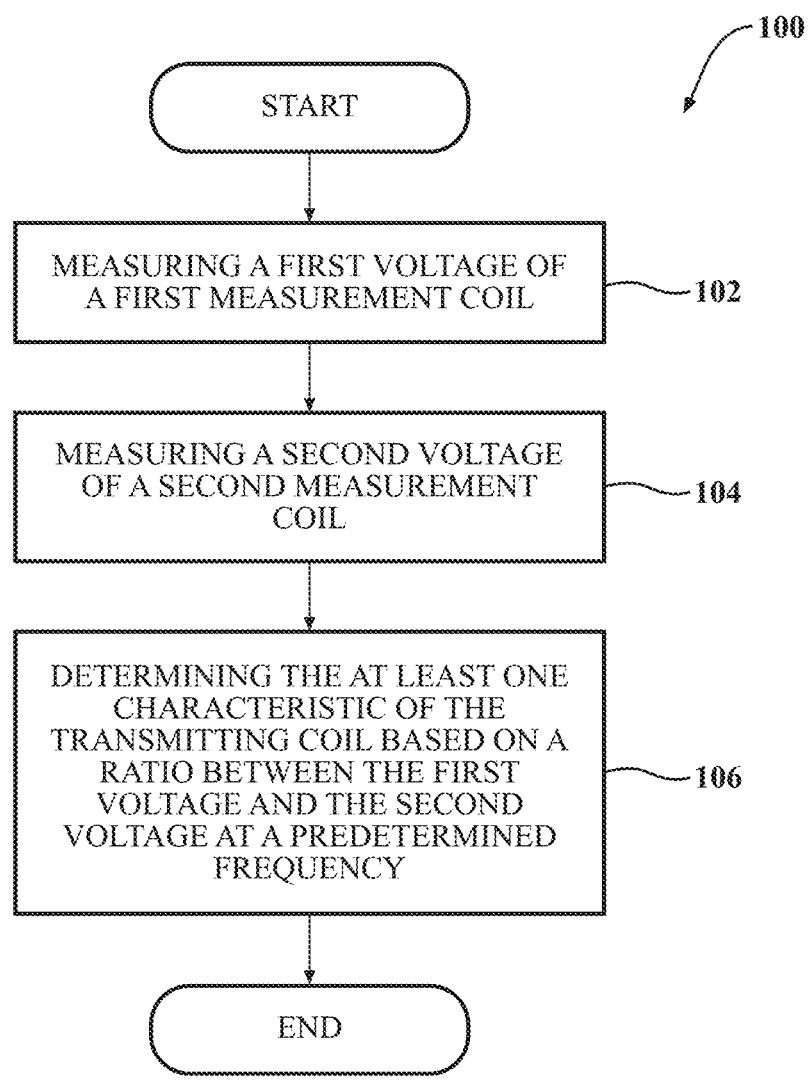
FIG. 13 illustrates a method for determining at least one characteristic of a transmission coil.

Referring to FIG. 13, a method 100 for determining one or more characteristics of the transmitting coil, such as transmitting coil 12, is shown. The method 100 is described from the perspective of the system 10 of FIG. 1 and the example shown in FIG. 4. However, it should be understood that the method 100 may be practiced in any one of a number of different ways and is not necessarily dependent on utilizing the system 10 of FIG. 1 as described. The method 100 begins at step 102, wherein the coil characteristic module 28 causes the processor 22 to measure a first voltage of a first measurement coil 14. The measurement of the first voltage of the first measurement coil 14 may be performed by a voltage measuring device 24 which measures the voltage of the first measurement coil 14 that was generated in response to receiving a magnetic field from the transmitting coil 12. The measurement of the first voltage of the first measurement coil 14 may be performed at a predetermined frequency. In one example, the predetermined frequency may be 11.7 MHz, but any frequency may be utilized.

In step 104, similarly to step 102, the coil characteristic module 28 causes the processor 22 to measure a second voltage of a second measurement coil 16 using the voltage measuring device 24. Again, this voltage of the second measurement coil 16 is produced in response to receiving a magnetic field from the transmitting coil 12. Like before, the measurement of the second measurement coil 16 may be performed at a predetermined frequency. In one example, the predetermined frequency may be 11.7 MHz, but any frequency may be utilized. Generally, it may be preferred that the same frequency be utilized in performing multiple measurements of multiple coils.

In the method 100, while only two measurements are taken of two measurement coils 14 and 16, it should be understood that, as explained previously, the system 10 could include any one of a number of different coils. Based on a number of coils, the steps 102 and/or 104 may be repeated for each additional set of coils.

In step 106, the coil characteristic module 28 causes the processor 22 to determine at least one characteristic of the transmitting coil 12 based on a ratio between the first and second voltages. Based on this ratio, one or more characteristics of the transmitting coil 12 can be determined. As previously described, these characteristics could include the direction that the transmitting coil 12 is wound and/or the angle of incidence from the magnetic field generated by the transmitting coil 12 to a location located between the measurement coils 14 and 16. If more than two coils are utilized, multiple angles of incidence can be determined between the multiple coils and the transmitting coil 12. By determining multiple angles of incidence and using the known positions of the multiple measurement coils, a two-dimensional or three-dimensional location of the origin of the magnetic field generated by the transmitting coil 12 and therefore the position of the transmitting coil 12 can be determined. The method 100 may be performed once or may be performed in multiple iterations.

It should be appreciated that any of the systems described in this specification can be configured in various arrangements with separate integrated circuits and/or chips. The circuits are connected via connection paths to provide for communicating signals between the separate circuits. Of course, while separate integrated circuits are discussed, in various embodiments, the circuits may be integrated into a common integrated circuit board. Additionally, the integrated circuits may be combined into fewer integrated circuits or divided into more integrated circuits.

In another embodiment, the described methods and/or their equivalents may be implemented with computer-executable instructions. Thus, in one embodiment, a non-transitory computer-readable medium is configured with stored computer-executable instructions that, when executed by a machine (e.g., processor, computer, and so on), cause the machine (and/or associated components) to perform the method.

While for purposes of simplicity of explanation, the illustrated methodologies in the figures are shown and described as a series of blocks, it is to be appreciated that the methodologies are not limited by the order of the blocks, as some blocks can occur in different orders and/or concurrently with other blocks from that shown and described. Moreover, less than all the illustrated blocks may be used to implement an example methodology. Blocks may be combined or separated into multiple components. Furthermore, additional and/or alternative methodologies can employ additional blocks that are not illustrated.

Detailed embodiments are disclosed herein. However, it is to be understood that the disclosed embodiments are intended only as examples. Therefore, specific structural and functional details disclosed herein are not to be interpreted as limiting, but merely as a basis for the claims and as a representative basis for teaching one skilled in the art to variously employ the aspects herein in virtually any appropriately detailed structure. Further, the terms and phrases used herein are not intended to be limiting but rather to provide an understandable description of possible implementations.

The flowcharts and block diagrams in the figures illustrate the architecture, functionality, and operation of possible implementations of systems, methods, and computer program products according to various embodiments. In this regard, each block in the flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

The systems, components and/or processes described above can be realized in hardware or a combination of hardware and software and can be realized in a centralized fashion in one processing system or in a distributed fashion where different elements are spread across several interconnected processing systems. Any kind of processing system or another apparatus adapted for carrying out the methods described herein is suited. A combination of hardware and software can be a processing system with computer-usable program code that, when being loaded and executed, controls the processing system such that it carries out the methods described herein. The systems, components and/or processes also can be embedded in a computer-readable storage, such as a computer program product or other data programs storage device, readable by a machine, tangibly embodying a program of instructions executable by the machine to perform methods and processes described herein. These elements also can be embedded in an application product which comprises all the features enabling the implementation of the methods described herein and, which when loaded in a processing system, is able to carry out these methods.

Furthermore, arrangements described herein may take the form of a computer program product embodied in one or more computer-readable media having computer-readable program code embodied, e.g., stored, thereon. Any combination of one or more computer-readable media may be utilized. The computer-readable medium may be a computer-readable signal medium or a computer-readable storage medium. The phrase "computer-readable storage medium" means a non-transitory storage medium. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Examples of such a computer-readable medium may include, but are not limited to, a floppy disk, a flexible disk, a hard disk, a magnetic tape, other magnetic medium, an ASIC, a graphics processing unit (GPU), a CD, other optical medium, a RAM, a ROM, a memory chip or card, a memory stick, and other media from which a computer, a processor or other electronic device can read. In the context of this document, a computer-readable storage medium may be any tangible medium that can contain or store a program for use by or in connection with an instruction execution system, apparatus, or device.

The following includes definitions of selected terms employed herein. The definitions include various examples and/or forms of components that fall within the scope of a term, and that may be used for various implementations. The examples are not intended to be limiting. Both singular and plural forms of terms may be within the definitions.

References to "one embodiment," "an embodiment," "one example," "an example," and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Module," as used herein, includes a computer or electrical hardware component(s), firmware, a non-transitory computer-readable medium that stores instructions, and/or combinations of these components configured to perform a function(s) or an action(s), and/or to cause a function or action from another logic, method, and/or system. Module may include a microprocessor controlled by an algorithm, a discrete logic (e.g., ASIC), an analog circuit, a digital circuit, a programmed logic device, a memory device including instructions that when executed perform an algorithm, and so on. A module, in one or more embodiments, may include one or more CMOS gates, combinations of gates, or other circuit components. Where multiple modules are described, one or more embodiments may include incorporating the multiple modules into one physical module component. Similarly, where a single module is described, one or more embodiments distribute the single module between multiple physical components.

Additionally, module, as used herein, includes routines, programs, objects, components, data structures, and so on that perform tasks or implement data types. In further aspects, a memory generally stores the noted modules. The memory associated with a module may be a buffer or cache embedded within a processor, a RAM, a ROM, a flash memory, or another suitable electronic storage medium. In still further aspects, a module as envisioned by the present disclosure is implemented as an application-specific integrated circuit (ASIC), a hardware component of a system on a chip (SoC), as a programmable logic array (PLA), as a graphics processing unit (GPU), or as another suitable hardware component that is embedded with a defined configuration set (e.g., instructions) for performing the disclosed functions.

In one or more arrangements, one or more of the modules described herein can include artificial or computational intelligence elements, e.g., neural network, fuzzy logic, or other machine learning algorithms. Further, in one or more arrangements, one or more of the modules can be distributed among a plurality of the modules described herein. In one or more arrangements, two or more of the modules described herein can be combined into a single module.

Program code embodied on a computer-readable medium may be transmitted using any appropriate medium, including but not limited to wireless, wireline, optical fiber, cable, RF, etc., or any suitable combination of the foregoing. Computer program code for carrying out operations for aspects of the present arrangements may be written in any combination of one or more programming languages, including an object-oriented programming language such as Java™, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The phrase "at least one of . . . and . . . " as used herein refers to and encompasses any and all possible combinations of one or more of the associated listed items. As an example, the phrase "at least one of A, B, and C" includes A only, B only, C only, or any combination thereof (e.g., AB, AC, BC, or ABC).

Aspects herein can be embodied in other forms without departing from the spirit or essential attributes thereof. Accordingly, reference should be made to the following claims, rather than to the foregoing specification, as indicating the scope hereof.

What is claimed is:

1. A system for determining at least one characteristic of a transmitting coil generating a magnetic field, the system comprising:
    a first measurement coil being wound in a right-handed direction;
    a second measurement coil being wound in a left-handed direction, the left-handed direction of the second measurement coil being opposite of the right-handed direction of the first measurement coil;
    the first measurement coil and the second measurement coil are adjacent to one another;
    a voltage measuring device configured to measure a first voltage of the first measurement coil in response to the magnetic field generated by the transmitting coil and measure a second voltage of the second measurement coil in response to the magnetic field generated by the transmitting coil; and
    at least one processor in communication with the voltage measuring device, the at least one processor being configured to determine the at least one characteristic of the transmitting coil based on a ratio between the first voltage and the second voltage at a predetermined frequency.

2. The system of claim 1, wherein the at least one characteristic of the transmitting coil is at least one of a direction that the transmitting coil is wound and an angle of incidence of the transmitting coil with respect to the first and second measurement coils, the direction that the transmitting coil is wound being one of a right-handed direction and a left-handed-direction.

3. The system of claim 1, wherein the first measurement coil and the second measurement coil are smaller than the transmitting coil.

4. The system of claim 3, wherein the first measurement coil and the second measurement coil are substantially the same size.

5. The system of claim 3, wherein the first measurement coil and second measurement coil are located at a distance from one another that is less than half a diameter of either the first measurement coil or the second measurement coil.

6. The system of claim 1, wherein the first measurement coil and the second measurement coil have substantially similar resonant frequencies.

7. The system of claim 6, wherein the first measurement coil, the second measurement coil, and the transmitting coil have substantially similar resonant frequencies.

8. The system of claim 1, further comprising a receiving coil configured to receive power from the transmitting coil.

9. The system of claim 8, further comprising a housing, wherein the first measurement coil, the second measurement coil, and the receiving coil are disposed within the housing.

10. The system of claim 1, further comprising:
at least one additional measurement coil adjacent to the first measurement coil and the second measurement coil;
the voltage measuring device configured to measure at least one additional voltage of the at least one additional measurement coil in response to the magnetic field generated by the transmitting coil; and
the at least one processor being configured to determine a three-dimensional angle of the transmitting coil with respect to the first, second, and at least one additional measurement coils based on one or more ratios between the first, second, and at least one additional voltages at the predetermined frequency.

11. The system of claim 10, wherein the first, second, and at least one additional measurement coils are substantially the same size.

12. The system of claim 10, wherein the first, second, and at least one additional measurement coils are spaced apart in a triangular arrangement.

13. The system of claim 10, wherein the first, second, and at least one additional measurement coils are spaced apart in a rectangular arrangement.

14. A method for determining at least one characteristic of a transmitting coil generating a magnetic field, the method comprising:
measuring a first voltage of a first measurement coil in response to the magnetic field generated by the transmitting coil, the first measurement coil being wound in a right-handed direction;
measuring a second voltage of a second measurement coil in response to the magnetic field generated by the transmitting coil, the second measurement coil being wound in a left-handed direction, the left-handed direction of the second measurement coil being opposite of the right-handed direction of the first measurement coil, the first measurement coil and the second measurement coil are adjacent to one another; and
determining the at least one characteristic of the transmitting coil based on a ratio between the first voltage and the second voltage at a predetermined frequency.

15. The method of claim 14, wherein the at least one characteristic of the transmitting coil is at least one of a direction that the transmitting coil is wound and an angle of incidence of the transmitting coil with respect to the first and second measurement coils, the direction that the transmitting coil is wound being one of a right-handed direction and a left-handed-direction.

16. The method of claim 14, wherein:
the first measurement coil and the second measurement coil are smaller than the transmitting coil; and
the first measurement coil and the second measurement coil are substantially the same size.

17. The method of claim 14, wherein the first measurement coil, the second measurement coil, and the transmitting coil have substantially similar resonant frequencies.

18. The method of claim 14, further comprising the steps of:
measuring at least one additional voltage of at least one additional measurement coil in response to the magnetic field generated by the transmitting coil, the at least one additional measurement coil adjacent to the first measurement coil and the second measurement coil; and
determining a three-dimensional angle of the transmitting coil with respect to the first, second, and at least one additional measurement coils based on one or more ratios between the first, second, and at least one additional voltages at the predetermined frequency.

19. A non-transitory computer-readable medium for determining at least one characteristic of a transmitting coil generating a magnetic field, the non-transitory computer-readable medium comprising instructions that when executed by one or more processors cause the one or more processors to:
measure a first voltage of a first measurement coil in response to the magnetic field generated by the transmitting coil, the first measurement coil being wound in a right-handed direction;
measure a second voltage of a second measurement coil in response to the magnetic field generated by the transmitting coil, the second measurement coil being wound in a left-handed direction, the left-handed direction of the second measurement coil being opposite of the right-handed direction of the first measurement coil, the first measurement coil and the second measurement coil are adjacent to one another; and
determine the at least one characteristic of the transmitting coil based on a ratio between the first voltage and the second voltage at a predetermined frequency.

20. The non-transitory computer-readable medium of claim 19, wherein the at least one characteristic of the transmitting coil is at least one of a direction that the transmitting coil is wound and an angle of incidence of the transmitting coil with respect to the first and second measurement coils, the direction that the transmitting coil is wound being one of a right-handed direction and a left-handed-direction.

* * * * *